United States Patent [19]
Park et al.

[11] Patent Number: 5,653,575
[45] Date of Patent: Aug. 5, 1997

[54] APPARATUS FOR TRANSFERRING LEAD FRAME

[75] Inventors: Bok Sik Park, Suwon; Sung Hee Cho, Cheonan; Deog Gyu Kim, Cheonan; Yong Choul Lee, Cheonan, all of Rep. of Korea

[73] Assignee: Samsung Electronics Co., Ltd., Kyungki-do, Rep. of Korea

[21] Appl. No.: 555,752

[22] Filed: Nov. 9, 1995

[30] Foreign Application Priority Data

Jul. 21, 1995 [KR] Rep. of Korea ............... 1995-21641

[51] Int. Cl.⁶ .................................................. B65G 59/04
[52] U.S. Cl. ...................... 414/797; 414/752; 294/64.1
[58] Field of Search ......................... 414/797, 796.9, 414/416, 750, 752, 929; 294/64.1; 901/6

[56] References Cited

U.S. PATENT DOCUMENTS

| | | | |
|---|---|---|---|
| 4,067,458 | 1/1978 | Schneider et al. | 414/797 |
| 4,720,227 | 1/1988 | Eberle | 414/797 |
| 4,960,361 | 10/1990 | Melzer | 414/797 |
| 4,978,275 | 12/1990 | Reid et al. | 414/797 |
| 5,207,331 | 5/1993 | Teegarden et al. | 414/797 |

FOREIGN PATENT DOCUMENTS

| | | | |
|---|---|---|---|
| 1122893 | 10/1962 | Germany | 414/797 |
| 3310990 | 9/1984 | Germany | 414/797 |
| 95022 | 4/1991 | Japan | 414/797 |

*Primary Examiner*—David A. Bucci
*Assistant Examiner*—Douglas Hess
*Attorney, Agent, or Firm*—Cushman Darby & Cushman IP Group of Pillsbury Madison & Sutro LLP

[57] ABSTRACT

An apparatus for serially transferring lead frames from a container containing a plurality of lead frames and buffering materials, which are stacked alternatively, to a die bonding process. The apparatus includes a guide bar provided with first pads for picking up a lead frame and second pads for picking up a sheet of buffering material, the first and second pads being moved concurrently downward and upward and vibrated.

4 Claims, 2 Drawing Sheets

APPARATUS FOR TRANSFERRING LEAD FRAME

BACKGROUND OF THE INVENTION

1. Field of the Invention

The present invention relates to an apparatus for transferring lead frame from a container thereof during semiconductor assembly process.

2. Description of the Prior Arts

Assembly of semiconductor begins with a die bonding process in which semiconductor chip formed with a desired circuit pattern is electrically connected to a lead frame. Lead frame shapes a semiconductor package, electrically connects chip to external terminals, and dissipates heat generated from the chip.

Usually, lead frames are stacked in a container (or stacker) when supplied by a manufacturer. A buffering material such as paper is interposed between lead frames in order to prevent a bend of leads of lead frame which may occur by a shock during transportation or handling, which eventually result in wire bonding failures. When transferring lead frame from the container to a die bonding guide rail, which carries lead frame to die bonding machine, it is required to remove individual lead frame from the container.

FIGS. 1 through 4 show a conventional apparatus and process for removing lead frame from a container.

With reference to FIG. 1, a plurality of lead frames (12) are stacked in a container (10), and papers as a buffering material is interposed between the lead frames. An apparatus (30) for transferring lead frame from container thereof comprises a guide bar (16) provided with vacuum pads (17), to which either of lead frame or paper is adhered by vacuum suction.

The overall process of transferring lead frames from the container to a die bonding guide rail shall be described hereinafter.

First, guide bar (16) provided with vacuum pads (17) moves down as indicated by arrow 1 until its vacuum pads contact uppermost lead frame (12) in the container (10) ("step 1"). Then, a vacuum suction machine (not shown) applies a vacuum suction to the pads (17) so that the uppermost lead frame (12) can adhere to the pads (17). And, the apparatus (30) carrying a lead frame goes up ("step 2").

With now reference to FIG. 2, the apparatus (30) carrying a lead frame is moved to a die bonding guide rail (18) to transfer the lead frame thereto ("step 3"). Now the apparatus (30) is located above the rail (18). Thereafter, the apparatus (30) goes down toward the rail (18) and drops the lead frame (12) ("step 4") upon elimination of vacuum suction, and goes upward ("step 5").

With now reference to FIG. 3, the apparatus (30) returns to its original location ("step 6"), and moves down until its vacuum pads contact uppermost paper (14) in the container (10) ("step 7"). Then, a vacuum suction to the pads (17) so that the uppermost paper (14) can adhere to the pads (17). And, the apparatus (30) carrying a paper goes up ("step 8").

With now reference to FIG. 4, the apparatus (30) carrying a paper is moved to a paper container (20) to transfer the paper thereto ("step 9"). Then, the apparatus (30) is operated in the same manner as that of transferring lead frame. That is to say, the apparatus (30) goes down toward the paper container (20) and drops the paper (14) ("step 10") upon elimination of vacuum suction, and goes upward ("step 11"). And, the apparatus (30) returns to its original location ("step 12").

As described above, the conventional apparatus and process for transferring a couple of a lead frame and a paper from container consists of 12 steps in total, which is a relatively time-consuming process.

Further, the conventional apparatus and process have an another drawback that when picking up a lead frame, the subsequent paper just beneath the lead frame is also picked up by an action of electricity.

SUMMARY OF THE INVENTION

Accordingly, an object of the present invention is to provide an apparatus which enables a more efficient removal of lead frame from a container thereof in a simple process.

This object can be accomplished by an apparatus for transferring a lead frame from a container containing a plurality of lead frames and buffering materials, which are stacked in the container alternatively, said lead frame being transferred to a die bonding process and said buffering material being transferred to a stacker, said apparatus being provided with first vacuum pads for picking up said lead frame and second vacuum pads for picking up said buffering material, and said first and second pads being moved concurrently downward and upward.

Further, the present invention provides an apparatus for transferring a lead frame as described above, which further comprises a vibrator for giving vibration to the vacuum pads when they pick up lead frame or buffering material.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE INVENTION

The present invention will now be described in more detail with reference to accompanying drawings.

Figure 5:
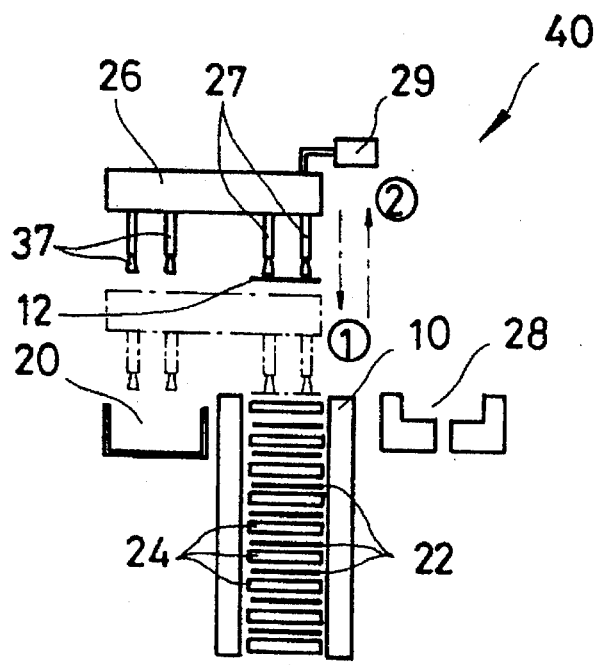
FIGS. 5 through 7 are schematic drawings showing an apparatus and process for transferring lead frame from a container according to the present invention.
Figure 6:
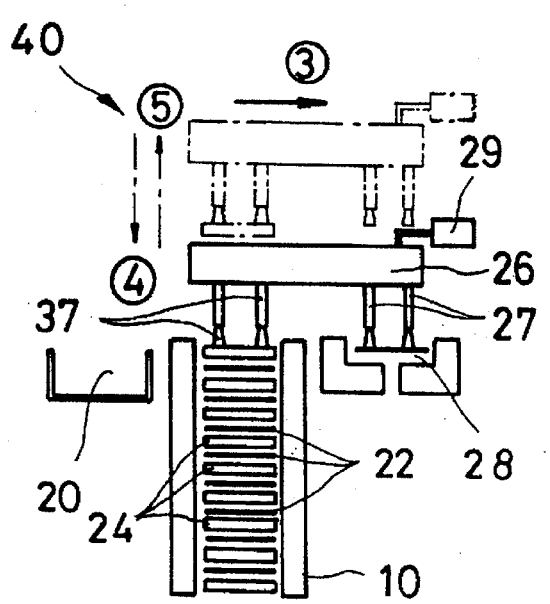
Figure 7:
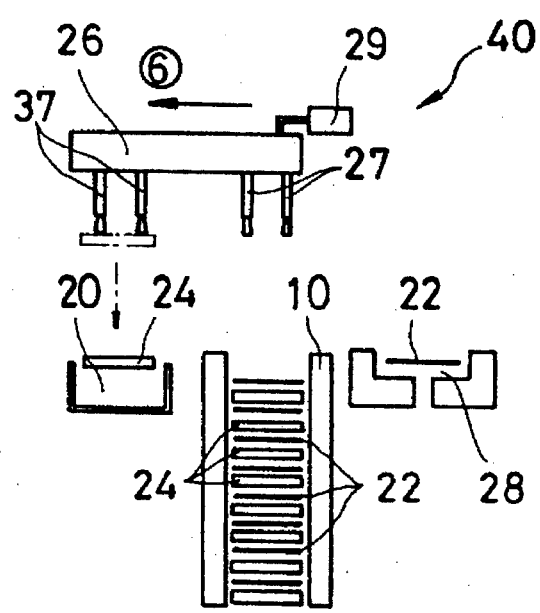

FIGS. 5 through 7 show an apparatus and process for transferring lead frame from a container into die bonding guide rail according to the present invention. To simplify drawings and explanations, only means relevant to the present invention are shown, and other means or machines such as driving and vacuum suction means are not shown.

The apparatus (40) comprises a guide bar (26) provided with first vacuum pads (27) for picking up a lead frame, and second vacuum pads (37) for picking up a buffering material. The guide bar (26) may have a plurality of first vacuum pads, and a plurality of second vacuum pads. The overall process will be described in more detail.

Figure 1:
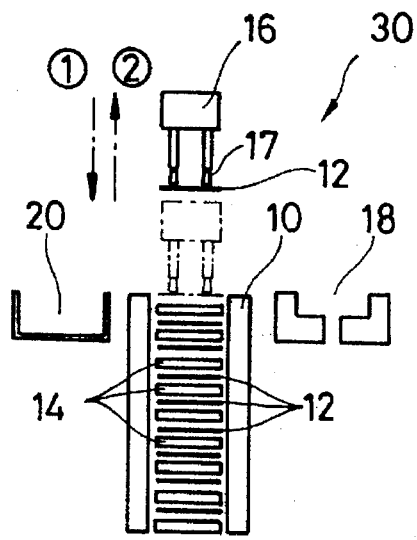
FIGS. 1 through 4 are schematic drawings showing a conventional apparatus and process for transferring lead frame from a container.
Figure 2:
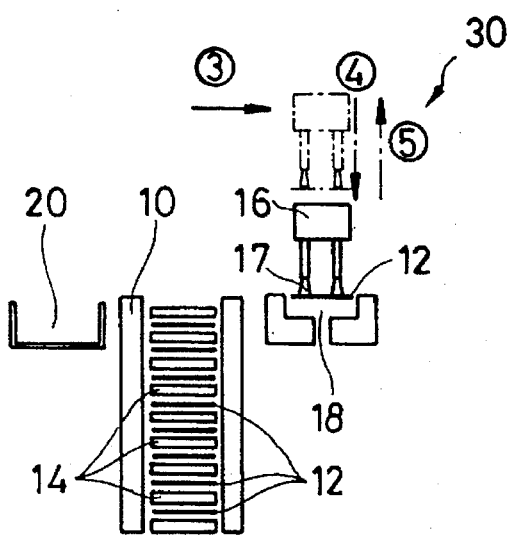
Figure 3:
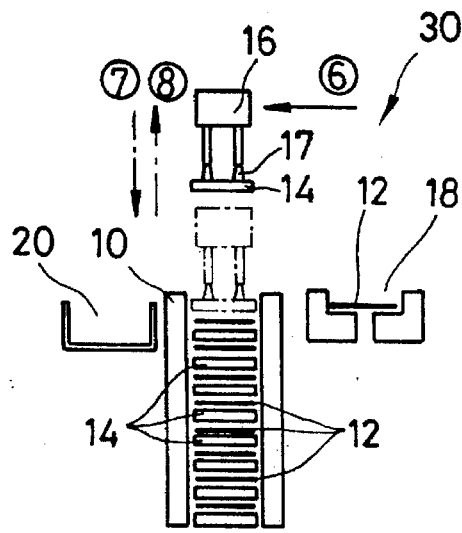
Figure 4:
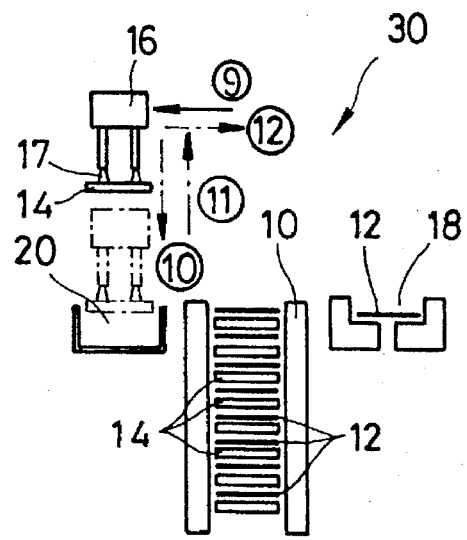

With reference to FIG. 5, a plurality of lead frames (22) and papers as a buffering material are stacked alternatively in a container (10), as described in the above in relation with FIG. 1.

For the first place, a guide bar (26) provided with first (27) and second (37) vacuum pads moves down until the first vacuum pads (27) contact uppermost lead frame (22) in the container (60) ("step 1"). At that time, the second vacuum pads (37) will locate above a paper stacker (20) as shown in FIG. 5.

Then, a vacuum suction means (not shown) applies a vacuum suction to the first pads (27) only so that the uppermost lead frame (22) can adhere to the first pads (27).

The apparatus according to the present invention comprises further a vibrator for giving vibration to the first and second vacuum pads when they pick up lead frame or buffering material. That is to say, a vibrator (29) works to provide vibration to the guide bar (26) and pads (27), (37) in order to ensure that a stacking material just below the material to be adhered to the pads is not accompanied to the adhered material.

The kind and location of vibrator may be easily determined by the ordinary skilled in the art so as to it provide a proper vibration to the guide bar and pads.

Then, the guide bar (26) carrying a lead frame goes up ("step 2").

With now reference to FIG. 6, the guide bar (26) carrying a lead frame is moved to a die bonding guide rail (28) ("step 3"). Now, the first pads (27) are located above the rail (28) while the second pads (37) are located above the lead frame container (10). Accordingly, when the apparatus (40) goes down toward, the first vacuum pads (27) drop the lead frame into the rail (28) upon elimination of vacuum, while the second pads (37) pick up a paper (24) upon application of vacuum ("step 4").

Thus, the first vacuum pads pick up a lead frame, and at the same time the second vacuum pads drop a paper, and vice versa. This concurrent on/off of vacuum suction of first/second pads can be attained by applying vacuum to the first pads while removing vacuum from the second pads, and vice versa.

In step 5, the guide bar (26) having the empty first pads and the second pads holding a paper moves up. Thereafter, the guide bar (26) moves to its original location where the second vacuum pads locate just above the paper stacker (20) while the first vacuum pads locate just above the lead frame container (10) ("step 6"). Then, the guide bar (26) goes down in order to drop the paper into the paper stacker and to pick up a paper, simultaneously.

Because the first vacuum pads (27) and second vacuum pads (37) are alternatively used for picking-up, carrying and depositing lead frames, their structures, as shown, preferably are alike.

Although preferred embodiments of the present invention have been described in detail hereinabove, it should be clearly understood that many variations and/or modifications of the basic inventive concepts herein taught which my appear to those skilled in the art will still fall within the spirit and scope of the present invention as defined in the appended claims.

What is claimed is:

1. Apparatus for destacking an alternatingly interleaved, central stack of lead frames and buffering papers into first and second respective containers disposed on laterally opposite sides of the central stack, said apparatus comprising:

at least one downwardly acting vertically movable first vacuum pad equipped for effectively communicating and cutting-off supply of vacuum thereto;

at least one downwardly acting vertically movable second vacuum pad equipped for effectively communicating and cutting-off supply of vacuum thereto;

a guide bar supporting in common each said first vacuum pad and each said second vacuum pad, for coordinated horizontal-direction shifting of the first and second vacuum pads, between:

a first position in which each said first vacuum pad is disposed in overlying vertical registry with said central stack and each said second vacuum pad is disposed in overlying vertical registry with said first container, and a second position in which each said first vacuum pad is disposed in overlying vertical registry with said second container, and each said second vacuum pad is disposed in overlying vertical registry with said central stack; and a vibrator associated with said guide bar and arranged to impart vibrations to each said first vacuum pad, for shaking the respective said buffering paper underlying a respective topmost said lead frame in said central stack as each said first vacuum pad is supplied with vacuum and said guide bar is operated for destacking the respective topmost lead frame from said central stack.

2. The apparatus of claim 1, wherein:

there are at least two of said first vacuum pads and at least two of said second vacuum pads.

3. The apparatus of claim 1, wherein:

said vibrator is mounted on said guide bar for vibrating said guide bar and thereby vibrating each said first vacuum pad.

4. The apparatus of claim 1, wherein:

said at least one downwardly acting vertically movable first vacuum pad structurally is substantially similar to said at least one downwardly acting vertically movable second vacuum pad.

\* \* \* \* \*